United States Patent
Worley (10) Patent No.: US 6,292,383 B1
(45) Date of Patent: Sep. 18, 2001

(54) REDUNDANT MEMORY CELL FOR DYNAMIC RANDOM ACCESS MEMORIES HAVING TWISTED BIT LINE ARCHITECTURES

(75) Inventor: James L. Worley, Flower Mound, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/559,028

(22) Filed: Apr. 25, 2000

(51) Int. Cl.[7] ...................................................... G11C 5/08
(52) U.S. Cl. ................................. 365/69; 365/200; 365/63
(58) Field of Search .................................. 365/69, 200, 63

(56) References Cited

U.S. PATENT DOCUMENTS 5,963,489 * 10/1999 Kirihata et al. ...................... 365/200

* cited by examiner

Primary Examiner—Huan Hoang
(74) Attorney, Agent, or Firm—Theodore E. Galanthay; Lisa K. Jorgenson; Andre Szuwalski (57) ABSTRACT

A dynamic random access memory (DRAM) device is disclosed. The DRAM device includes a memory cell array having a twisted bit line architecture. The memory cell array includes at least one pair of redundant rows of memory cells. Redundant row decode circuitry is capable of configuring the pair of redundant rows to replace any one row of memory cells having a defect. Each pair of bit lines is coupled to a distinct memory cell from each redundant row of the redundant row pair so that both the true and complement version of a data value is maintained by the redundant row pair. Rows of reference cells are disconnected and/or disabled during a memory access operation involving the redundant row pair. The use of a pair of redundant rows of memory cells to replace a single row of memory cells having a defect substantially reduces the complexity of decode circuitry for enabling the rows of reference cells.

24 Claims, 5 Drawing Sheets

REDUNDANT MEMORY CELL FOR DYNAMIC RANDOM ACCESS MEMORIES HAVING TWISTED BIT LINE ARCHITECTURES

BACKGROUND OF THE INVENTION

1. Technical Field of the Invention

The present invention relates to redundant rows of memory cells for dynamic random access memory (DRAM) devices, and particularly to the use of redundant rows of memory cells for DRAM devices having a twisted bit line architecture.

2. Background of the Invention

A conventional DRAM device includes an array of memory cells organized into rows and columns. Each row of memory cells is coupled to an individual word line, and each column of memory cells is coupled to an individual bit line. The array further includes rows of reference cells which cooperate with a selected row of memory cells to place a charge differential on each pair of bit lines during a memory access operation for determining the data values stored in the memory cells.

In particular, a reference cell and a memory cell from an addressed row are connected to a bit line pair during a memory access operation and present a charge differential thereon to be sensed. The memory cell is then refreshed and the DRAM output is driven (during a memory read operation) to a voltage level representing either a high or a low logic level based upon the polarity of the charge differential.

Figure 1:
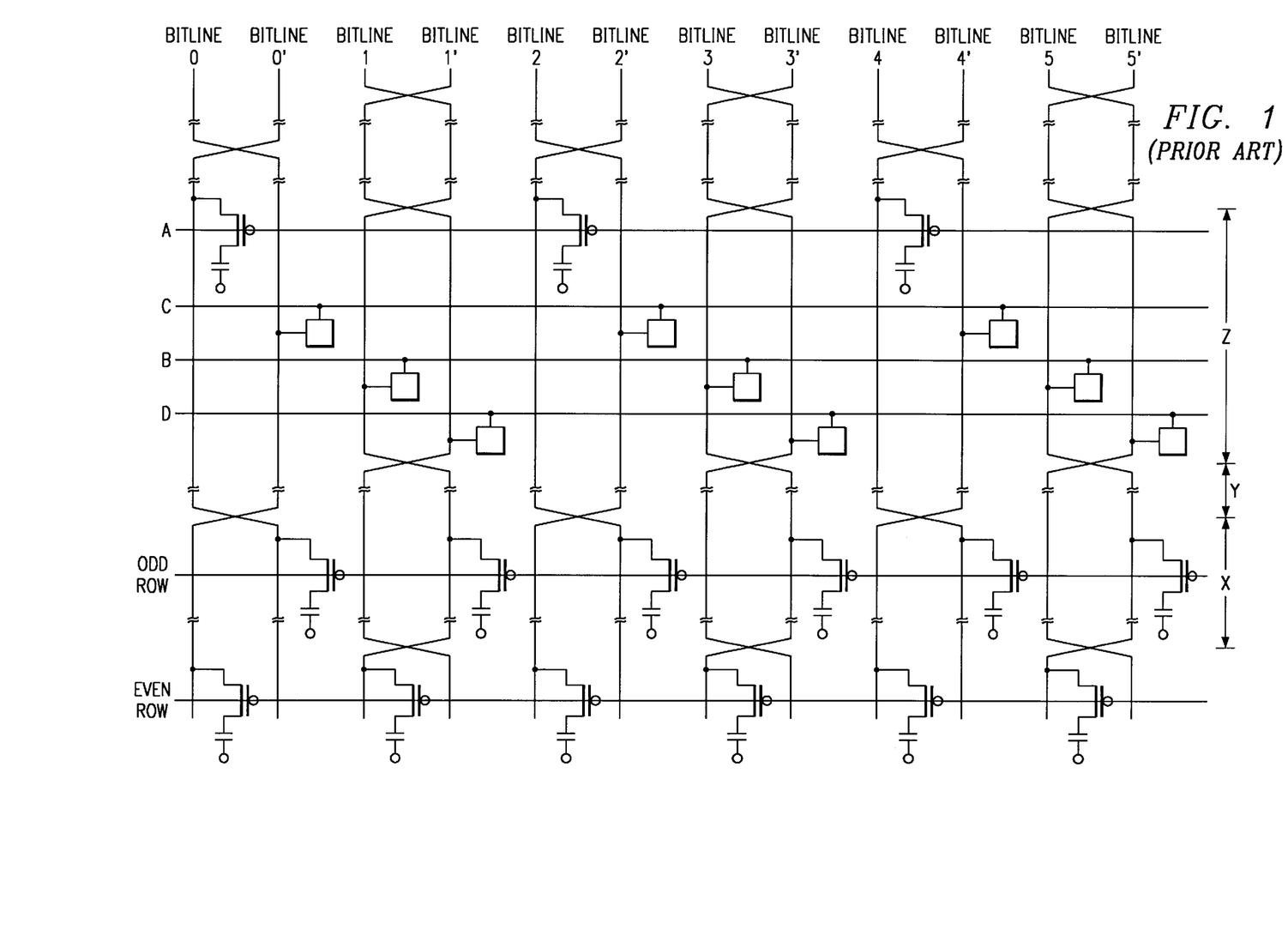
FIG. 1 is a diagram of a conventional DRAM cell array having a twisted bit line architecture.

Memory cell arrays typically employ a twisted bit line architecture in which bit lines of the bit line pairs are twisted at one or more locations so as to compensate for signal coupling to adjacent bit lines. FIG. 1 illustrates a typical twisted bit line architecture for a DRAM device. As can be seen, the twist locations corresponding to a bit line pair are substantially evenly distributed therealong.

Although only two rows of reference cells are needed for an untwisted bit line architecture (a first row of reference cells being connected to the true bit lines and a second row of reference cells being connected to the complement bit lines), a greater number of reference cells are required to execute a memory access operation by a DRAM device employing a twisted bit line architecture. In the conventional DRAM cell array of FIG. 1, four rows of reference cells A–D are required.

The decoding of the four rows of reference cells is dependent upon the location of the addressed row of memory cells relative to the twist locations. For instance, an even (odd) row of memory cells in region X requires reference rows A and B (C and D) to be connected to the bit lines. An even (odd) row of memory cells in region Y requires reference rows B and C (A and D) to be connected to the bit lines. As can be seen, the decoding of rows of reference cells is more complicated in DRAM devices having a twisted bit line architecture.

Conventional DRAM devices may typically include one or more redundant rows of memory cells that are adapted to replace a row of memory cells in the memory cell array having a defect. When redundant rows are implemented in a memory cell array having a twisted bit line architecture, the decoding of the reference row must take into account the location of the redundant row that replaces the defective row.

A prior approach to decoding the rows of reference cells is to dispose one or more redundant rows in each region bounded by bit line twists (regions X—X, Y—Y, Z—Z, etc.) and only replace defective rows with a redundant row in the same region. This approach, however, disadvantageously results in an increase in circuitry overhead and a limited use of the redundant rows, hence poorer efficiency.

In light of the foregoing, there is a need for a DRAM device having a twisted bit line architecture which effectively utilizes redundant rows of memory cells in the event of a memory cell row having a defect.

SUMMARY OF THE INVENTION

The present invention overcomes the above-identified shortcomings and satisfies a significant need for a dynamic random access memory (DRAM) having a twisted bit line architecture that effectively replaces defective rows of memory cells. The DRAM includes a memory cell array having at least one pair of redundant rows of memory cells. Each memory cell from a first redundant row of the redundant row pair is coupled to a distinct true bit line, and each memory cell from a second redundant row of the redundant row pair is coupled to a distinct complement bit line. The redundant memory cells associated with a bit line pair store a data true and data complement version of a data value. Memory cells in both the first and second redundant rows are activated and/or connected to the bit line pairs when the address value corresponding to the defective row which the redundant row pair replaces is provided to the DRAM. In this way, each pair of redundant rows of memory cells is configurable for replacing any one row of memory cells having a defect. Because the true and complement versions of the data value are stored and placed on the bit lines of a bit line pair, rows of reference cells in the memory cell array are unneeded in performing a memory access operation involving the redundant row pair.

Execution of a memory access operation of the DRAM includes receiving an address corresponding to a row of memory cells having a defect, activating a pair of redundant rows of memory cells which was previously configured to replace the addressed row of memory cells having a defect, and disconnecting each of the rows of reference cells throughout the memory access operation.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown.

Figure 2:
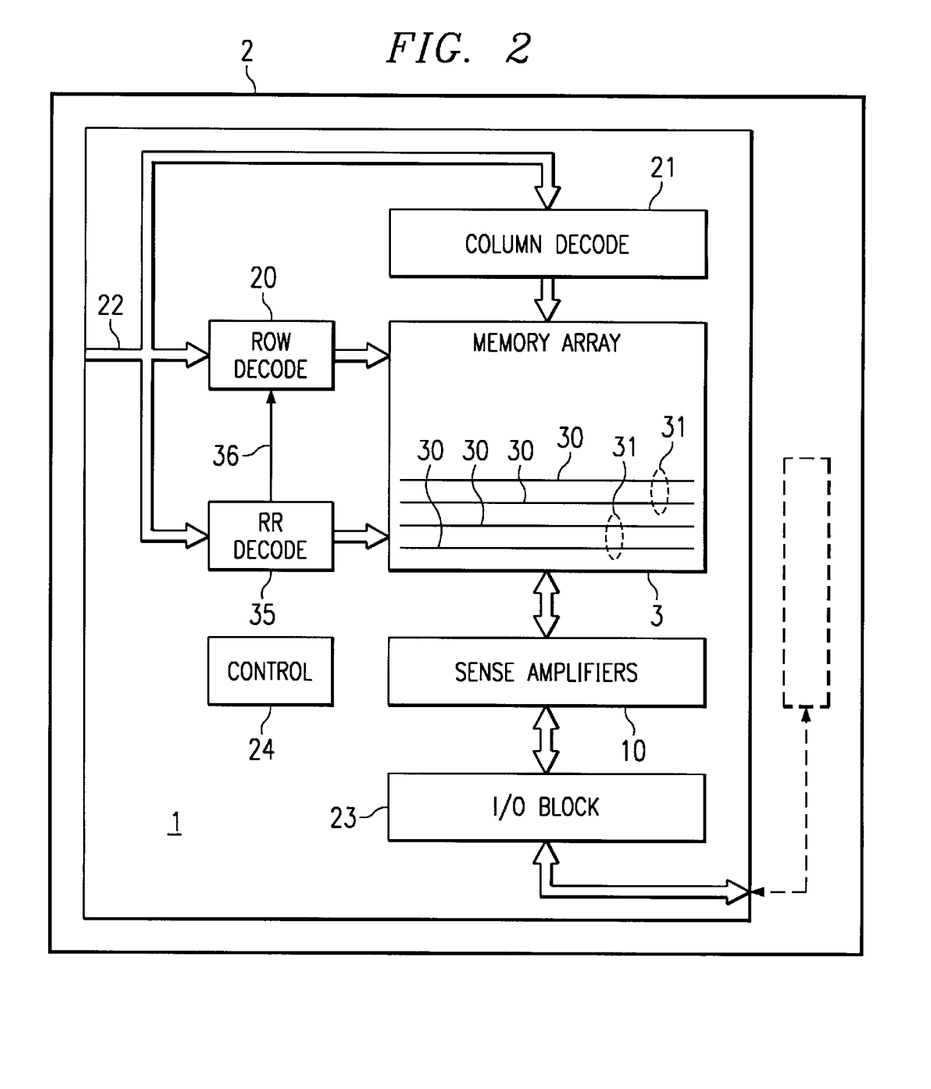
FIG. 2 is a diagram of an integrated circuit including a dynamic random access memory device according to a preferred embodiment of the present invention.
Figure 3A:
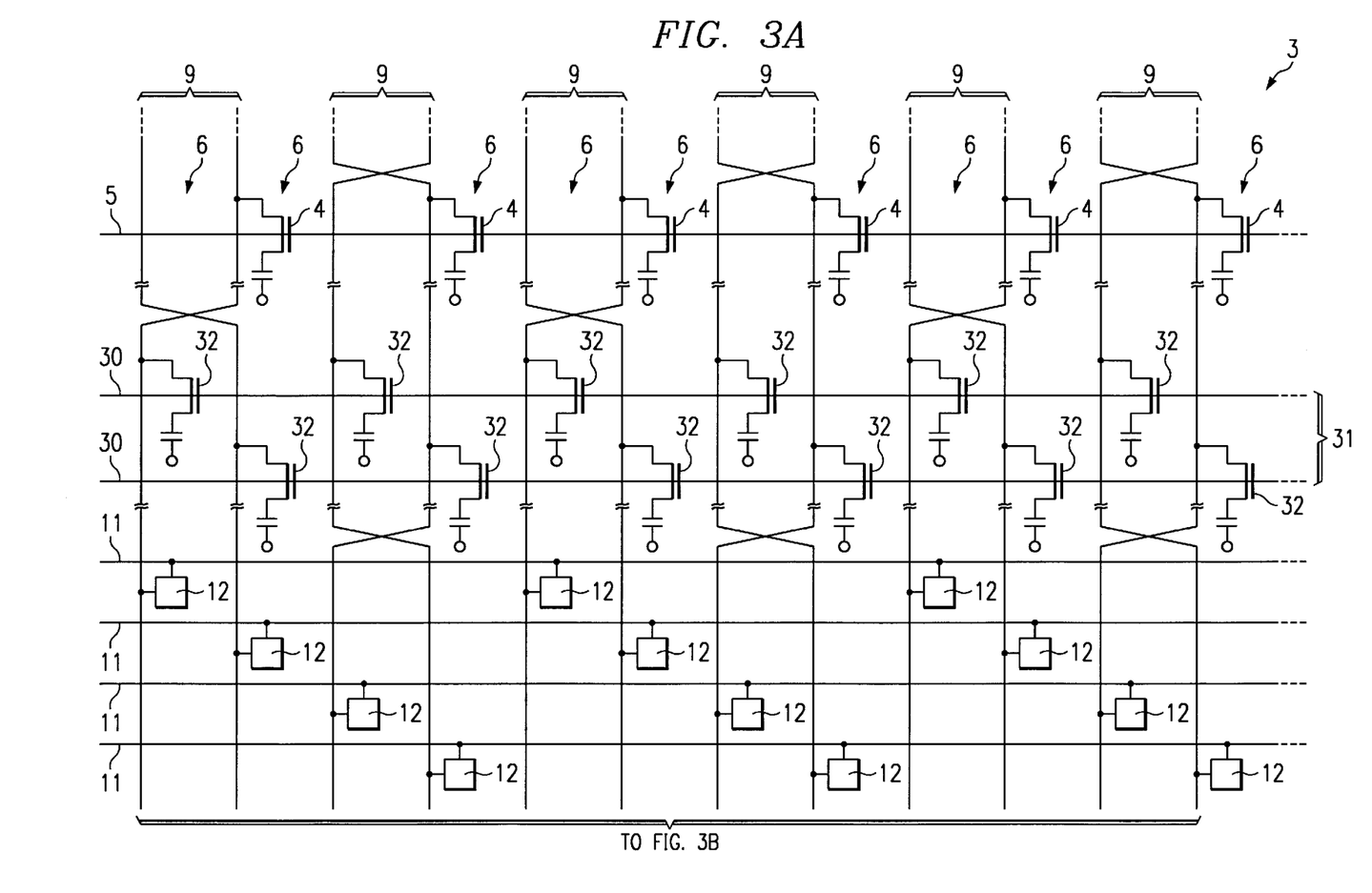
FIG. 3 illustrates a portion of a memory cell array of the dynamic random access memory device shown in FIG. 2.
Figure 3B:
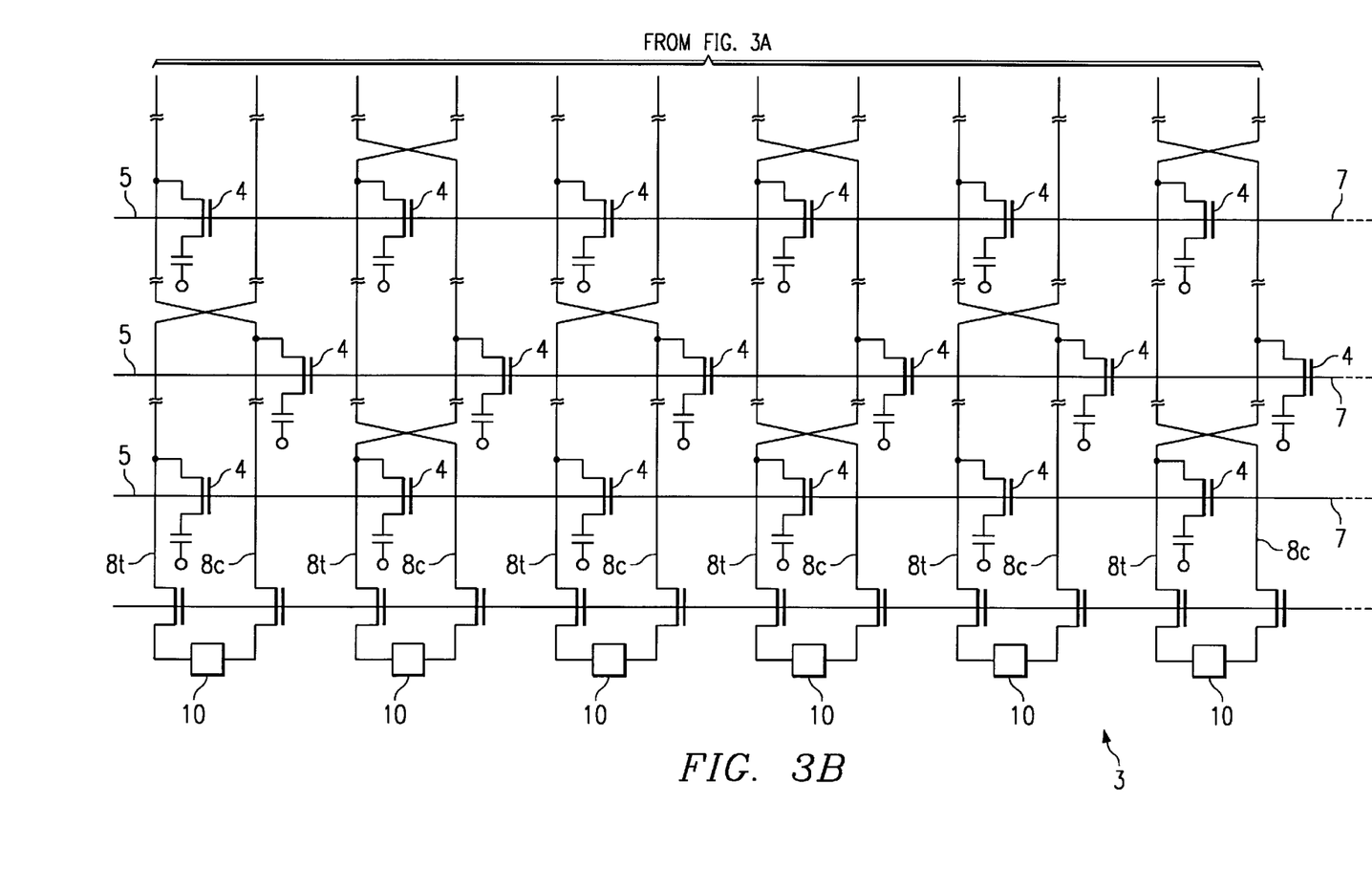

Referring to FIGS. 2–3, there is shown a dynamic random access memory (DRAM) device 1 according to a preferred embodiment of the present invention. DRAM device 1 may form part or all of an integrated circuit 2. For example, DRAM device 1 may be a stand-alone, off-the-shelf memory device 2. Alternatively, DRAM device 1 may be an embedded memory within integrated circuit 2 that also includes application specific circuitry (shown in dashed lines) so as to form an application specific integrated circuit (ASIC).

DRAM device 1 includes a memory cell array 3 having memory cells 4 organized into a plurality of rows 5 and columns 6 (FIG. 3). Each row 5 of memory cells 4 is coupled to a distinct word line 7, and each column 6 of memory cells 4 is coupled to a distinct bit line 8. A row of memory cells 4 is activated and connected to bit lines 8 upon the corresponding word line 7 being driven to a high supply voltage Vdd. Bit lines 8 are grouped into bit line pairs 9 such that each bit line pair 9 includes a true bit line 8*t* and complement bit line 8*c*. Each bit line pair 9 is coupled to a distinct sense amplifier 10. Each sense amplifier 10 senses a charge differential appearing across the corresponding bit lines 8 connected thereto and drives bit lines 8 towards high supply voltage Vdd and a low supply voltage Vss based upon the polarity of the charge differential. Memory cells 3, word lines 7, bit lines 8 and sense amplifiers 10 function to execute memory read, write and refresh operations as is known in the art.

For each bit line pair 9, the bit lines 8 thereof are twisted to substantially compensate for or otherwise balance signal coupling between adjacent bit lines 8 prior to sensing of bit lines 8 by corresponding sense amplifier 10. In a preferred embodiment of the present invention shown in FIG. 3, the number of evenly distributed twists in a bit line pair 9 is different from the number of evenly distributed twists in an adjacent bit line pair 9 by a factor of two. In other words, odd (even) numbered bit line pairs 9 have twice (half) as many evenly distributed twists than the even (odd) bit line pairs 9. It is understood that the relationship of twist number and location between adjacent bit line pairs 9 may be different from that shown in FIG. 3.

Memory cell array 3 includes a plurality of rows 11 of reference cells 12. Reference cells 12 are coupled to bit lines 8 so as to provide a charge thereon when activated that is between a charge corresponding to a logic high level and a charge corresponding to a logic low level. In this way, a charge differential may be provided across a bit line pair 9 by connecting an addressed memory cell 4 to a first bit line 8 of a bit line pair 9 and a selected reference cell 12 to a second bit line 8 of bit line pair 9.

In a DRAM device having an untwisted bit line architecture, only two rows 11 of reference cells 12 are needed (a first row having reference cells connected to the true bit lines 8*t*, and a second row having reference cells connected to the complement bit lines 8*c*). Because bit lines 8 have a twisted architecture, however, more than two rows of reference cells 12 are required in order to execute a memory access operation involving a row 5 of memory cells 4. In the embodiment having the twisted bit line architecture illustrated in FIG. 3, four rows of reference cells 12 are needed when writing data to or reading data from memory cells 4 in a memory cell row 5.

Referring to FIG. 2, DRAM device 1 includes row decoder 20 and column decoder 21 which receive as an input an address value placed on address bus 22 and select the corresponding word line 7 and bit line(s) 8, respectively, so that the appropriate memory cells 4 are accessed. DRAM device 1 further includes a data input/output (I/O) block 23 that provides data to be stored in memory cell array 3 and data read from memory cell array 3 as an output of the DRAM device 1. Control block 24 cooperates with row decoder 20, column decoder 21, sense amplifiers 10, and data I/O block 23 in order to perform necessary control functions in executing memory read, write and refresh operations.

In order to increase device yield, DRAM device 1 further includes redundant rows 30 of redundant memory cells 32 that are adapted to replace a row 5 of memory cells 4 having a defect that renders the row 5 unusable. According to a preferred embodiment of the present invention, redundant rows 30 of redundant memory cells 32 are grouped into pairs 31. Each redundant row pair 31 includes a first redundant row 30 of redundant memory cells 32 coupled to true bit lines 8*t* and a second redundant row of redundant memory cells 32 coupled to complement bit lines 8*c*. Each true bit line 8*t* is coupled to a distinct redundant memory cell 32 in the first redundant row 30 and each complement bit line 8*c* is coupled to a distinct redundant memory cell 32 in the second redundant row 30. The redundant memory cells 32 connected to the true bit line 8*t* and complement bit line 8*c* of bit line pair 9 are capable of storing a data value in differential form. In other words, both the true and complement form of the data value is maintained by the pair of redundant memory cells 32 associated with bit line pair 9.

In the preferred embodiment of the present invention, a pair 31 of redundant rows 30 is capable of replacing a single row 5 of memory cells 4 having a defect. Specifically, the two redundant memory cells 32 of redundant row pair 31 that are coupled to a bit line pair 9 are simultaneously connected thereto to store charges that represent a data value. One of the two redundant memory cells 32 is charged to the high supply voltage Vdd and the other of the two redundant memory cells 32 is charged to the low supply voltage Vss. When connected to bit lines 8 of an associated bit line pair 9, the two redundant memory cells 32 present a charge differential on bit line pair 9 having a polarity that represents the desired data value. The charge differential is suitably sized so that the sense amplifier 10 connected to the bit line pair 9 is capable of sensing the charge differential and driving the bit lines 8 to the high supply voltage Vdd and low supply voltage Vss based upon the polarity of the charge differential.

In order to appropriately activate redundant rows 30 of redundant memory cells 32, DRAM device 1 includes a redundant row decoder 35 that activates each redundant row pair 31 when the corresponding defective memory cell row 5 is identified in the address placed on address bus 22.

Because two redundant memory cells 32 from each of the redundant rows 30 in a redundant row pair 31 are connected to a bit line pair 9 and together provide a charge differential on the corresponding bit line pair 32 representing a data value, it is not necessary to utilize a reference cell 12 to create the charge differential when accessing data stored in redundant row pair 31. Accordingly, the reference cell rows 11 are deactivated during a memory access operation that accesses data from a redundant row pair 31. In an exemplary embodiment of the present invention, whenever a redundant row pair 31 is activated and connected to bit lines 8, redundant row decoder 35 generates a disable signal 36 (FIG. 2) that is an input to row decoder 20 and asserted to disable the activation and/or connection of all the reference cell rows 11 to bit lines 8.

Figure 4:
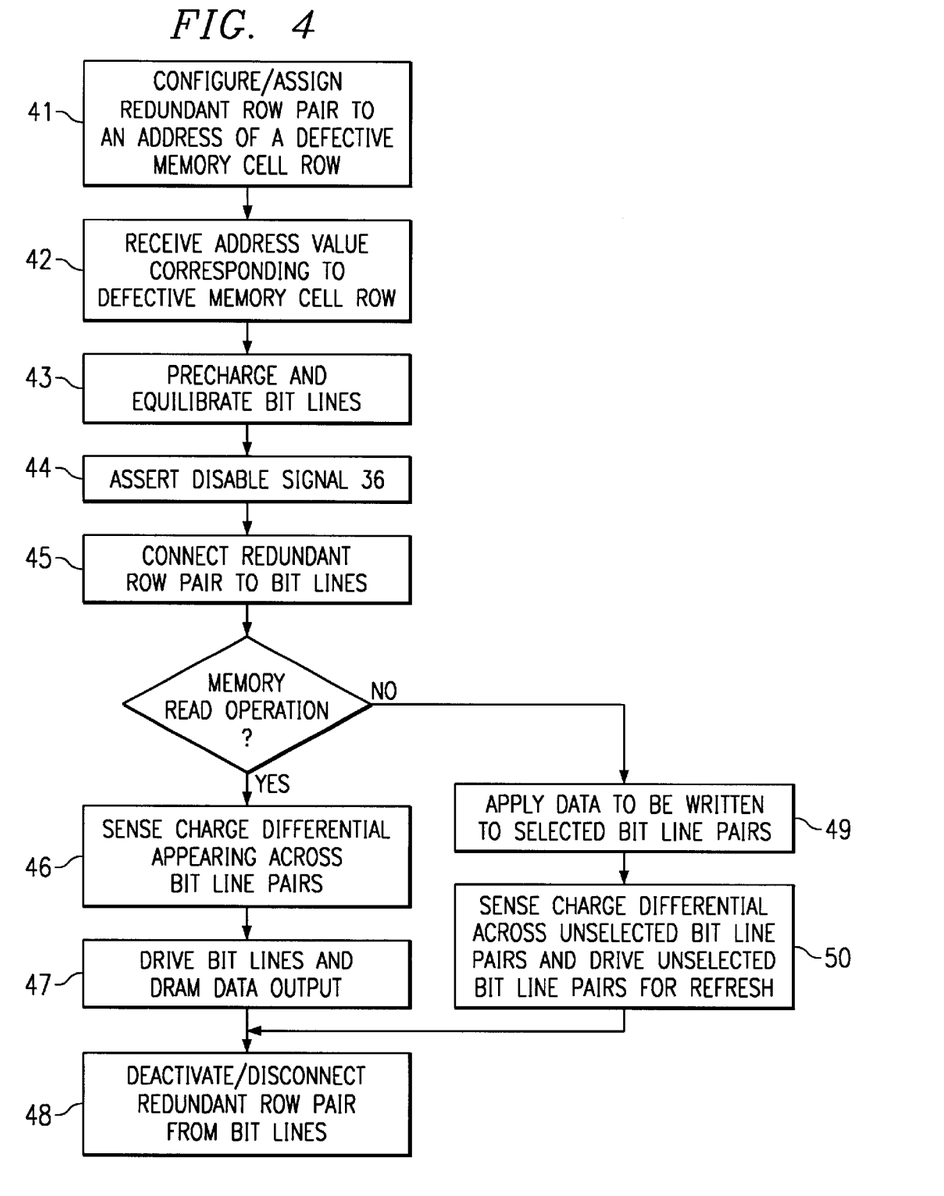
FIG. 4 is a flow chart illustrating an operation of the dynamic random access memory device according to a preferred embodiment of the present invention.

The operation of the present invention will be described with reference to FIG. 4. Initially, DRAM device 1, which forms part or all of integrated circuit 2, is tested for compliance with timing and functionality requirements. In the event a memory cell 4 is found to contain a defect during the course of testing DRAM device 1, DRAM device 1 is configured and/or programmed at step 41 so that the row 5 having the defective memory cell 4 is replaced with a pair 31 of redundant rows 30. This may be performed, for example, by breaking fuses in row decoder 20 and/or redundant row decoder 35 (not shown). At this point, the redundant memory cells 32 in redundant row pair 31 are utilized to store data that is intended to be stored in the memory cells 4 of the row 5 having the defect.

In particular, when the address value corresponding to the row 5 having the defective memory cell 4 is received on address bus 22 (step 42) at the start of a memory access operation, bit lines 8 are precharged and equilibrated at step 43. The step of and circuitry for precharging and equilibrating bit lines 8 are known in the art and will not be discussed. Upon detecting the address value corresponding to the defective memory cell row 5, redundant row decoder 35 asserts disable signal 36 at step 44 which causes row decoder 20 to disconnect (or prevent the connection of) every row 11 of reference cells 12 from (to) bit lines 8. At approximately the same time, redundant rows 30 of redundant row pair 31 are activated so that redundant memory cells 32 of the redundant rows 30 of the selected redundant row pair 31 are electrically connected to bit lines 8 at step 45. The charge stored in the redundant memory cells 32 connected to each bit line pair 9 is placed on and/or otherwise shared with the corresponding bit lines 8. Because the charge stored on the redundant memory cells 32 connected to each bit line pair 9 contain both the true and the complement version of the stored data value, a charge differential is created across each bit line pair 9 representative of the stored data value.

In the case of a memory read operation, sense amplifiers 10 then sense at step 46 the charge differential appearing on each bit line pair 9 and drive the bit lines 8 at step 47 towards the high supply voltage Vdd or the low supply voltage Vss based upon the polarity of the charge differential corresponding thereto. Being connected to bit lines 8, redundant memory cells 32 are also charged to either the high supply voltage Vdd or low supply voltage Vss at this time. Selected bit line pairs 9 are connected to data I/O block 23 at step 47 to drive the output of DRAM device 1 to voltage levels corresponding to the data stored in the selected redundant memory cells 32. The memory read operation is complete upon redundant memory cells 32 in redundant row pair 31 being disconnected from bit lines 8 in step 48.

In the case of a memory write operation, data to be stored in DRAM device 1 is placed onto one or more selected bit line pairs 9 at step 49 following step 45. The data is presented in differential form with both the true and complement version of the data appearing on bit lines 8 of the selected bit line pairs 9. In this manner, bit lines 8 of the selected bit line pair(s) 9 as well as the redundant memory cells 32 connected thereto are driven towards either the high supply voltage Vdd or the low supply voltage Vss. Concerning the bit line pairs 9 thereof that are not selected for the storing of the new data, the bit lines 8 thereof as well as the redundant memory cells 32 connected thereto are driven to Vdd or Vss at step 50 by sense amplifiers 10 associated therewith, as described above with respect to steps 46 and 47 of the memory read operation. The memory write operation is complete by redundant row decoder 20 deactivating and/or disconnecting redundant row pair 31 from bit lines 8.

The use of redundant rows 30 in pairs so as to replace a single defective row 5 of memory cells 4 provides a number of benefits. For instance, the decoding circuitry for decoding reference rows 11 is not further complicated by the existence of redundant rows 30. In fact, the additional circuitry for disabling row decoder 20 from connecting reference rows 11 to bit lines 8 results in a trivial increase in overhead. Because both the true and complement of a data value is stored by memory cells 32 of a redundant row pair 31 corresponding to a bit line pair 9, the noise margin for redundant memory cells 32 is increased relative to the noise margin for memory cells 4. In addition, a pair 31 of redundant rows 30 may replace either an even-numbered or odd-numbered defective memory cell row 5. The redundant row pair(s) 31 may also be placed in memory cell array 3 independently of the location or number of twists in bit line pairs 8.

The invention being thus described, it will be understood that the same may be varied in many ways. Such variations are not to be regarded as a departure from the spirit and scope of the invention, and all such modifications as would be understood to one skilled in the art are intended to be included within the scope of the following claims.

What is claimed is:

1. A dynamic random access memory (DRAM) device, comprising:

a memory cell array comprising a plurality of memory cells arranged as a plurality of rows and columns of memory cells, a plurality of pairs of bit lines wherein each bit line is coupled to a distinct column of memory cells and each bit line pair has a twisted architecture, a plurality of rows of reference cells, and a pair of redundant rows of memory cells that is configurable for replacing any one row of memory cells having a defect;

row decode circuitry for connecting a row of memory cells and one or more corresponding rows of reference cells to the bit line pairs based upon an address value provided to the DRAM device; and redundant row decode circuitry that connects the pair of redundant rows of memory cells to the bit line pairs in response to an address value corresponding to a row of memory cells having a defect being provided to the DRAM device.

2. The DRAM device of claim 1, wherein:

the row decode circuitry disconnects each row of reference cells from the bit line pairs when the pair of redundant rows of memory cells is connected to the bit line pairs.

3. The DRAM device of claim 2, wherein:

the redundant row decode circuitry generates a disable signal that drives an input to the row decode circuitry so as to disconnect each row of reference cells from the bit line pairs when the pairs of redundant rows of memory cells is connected thereto.

4. The DRAM device of claim 1, wherein:

the location of the pair of redundant rows of memory cells is independent of the location of twists in the bit line pairs.

5. The DRAM device of claim 1, wherein:

the location of the pair of redundant rows of memory cells is independent of the number of twists in one or more pairs of bit lines.

6. The DRAM device of claim 1, wherein:

each bit line pair comprises a true bit line and a complement bit line;

each memory cell in a first redundant row of the redundant row pair is coupled to a distinct true bit line; and each memory cell in a second redundant row of the redundant row pair is coupled to a distinct complement bit line so that each bit line pair is coupled to a memory cell in the first and that the memory cells in the redundant row pair that are coupled to a bit line pair store a data value therebetween.

7. A dynamic random access (DRAM) device, comprising:
a memory cell array comprising:
a plurality of memory cells arranged as a plurality of rows and columns of memory cells;
a plurality of pairs of bit lines wherein each bit line is coupled to a distinct column of memory cells and bit lines for one or more pairs of bit lines are twisted at one or more locations; and
a pair of redundant rows of memory cells configurable for replacing any one row of memory cells having a defect, wherein each memory cell from a first redundant row of memory cells of the redundant row pair is connected to a distinct true bit line, and each memory cell from a second redundant row of memory cells of the redundant row pair is connected to a distinct complement bit line and cooperates with a memory cell from the first redundant row of memory cells to store a data value;
row decode circuitry for selectively activating a row of memory cells based upon an address value provided to the DRAM device; and
redundant row decode circuitry for selectively activating the pair of redundant rows of memory cells upon the reception of an address value by the DRAM device corresponding to a row of memory cells to which the pair of redundant rows is configured to replace.

8. The DRAM device of claim 7, wherein:
the address value comprises an address value corresponding to a particular row of memory cells having a defect.

9. The DRAM device of claim 7, further comprising:
a plurality of rows of reference cells for providing a reference charge to the bit line pairs during a memory access operation;
wherein the redundant row decode circuitry disconnects the rows of reference cells from the bit lines when the pair of redundant rows of memory cells is connected thereto by the redundant row decode circuitry.

10. The DRAM device of claim 9, wherein:
the rows of reference cells are selectively disconnected to the bit lines by the row decode circuitry; and
the redundant row decode circuitry selectively generates a disable signal which causes the row decode circuitry to disconnect the rows of reference cells from the bit lines when enabled.

11. The DRAM device of claim 7, wherein:
each redundant row of memory cells is located within the memory cell array independently of a location of twists in the bit line pairs.

12. The DRAM device of claim 7, wherein:
for each pair of bit lines, the memory cells in the redundant rows coupled thereto simultaneously store a charge representing a logic high level and a logic low level when the redundant rows of memory cells are utilized to store data.

13. The DRAM device of claim 7, wherein:
each redundant row of memory cells is located within the memory cell array independently of the number of twists in one or more of the bit line pairs.

14. An integrated circuit, comprising:
a memory cell array comprising:
a plurality of memory cells arranged as a plurality of rows and columns of memory cells;
a plurality of pairs of bit lines wherein each bit line is connected to a distinct column of memory cells and each bit line pair has a twisted architecture and includes a true bit line and a complement bit line;
a plurality of rows of reference cells; and
a pair of redundant rows of memory cells for selectively replacing a row of memory cells having a defect, wherein each memory cell from a first row of the redundant row pair is coupled to a distinct true bit line and each memory cell from a second row of the redundant row pair is coupled to a distinct complement bit line;
row decode circuitry for selectively connecting a row of memory cells and one or more corresponding rows of reference cells to the bit line pairs based upon an address value provided to the DRAM device; and
redundant row decode circuitry for selectively connecting the pair of redundant rows of memory cells to the bit line pairs in response to an address value being provided to the DRAM device corresponding to a row of memory cells having a defect.

15. The integrated circuit of claim 14, wherein:
the memory cell array, row decode circuitry and redundant row decode circuitry form an embedded dynamic random access memory device.

16. The integrated circuit of claim 15, further including:
application specific integrated circuitry connected to the embedded dynamic random access memory device.

17. The integrated circuit of claim 14, wherein:
the integrated circuit comprises a dynamic random access memory device.

18. The integrated circuit of claim 14, wherein:
for each bit line pair, the memory cell of the first row of the redundant row pair and the memory cell of the second row of redundant row pair coupled thereto store a differential pair of charges that represent a data logic value.

19. The integrated circuit of claim 14, wherein:
the row decode circuitry disconnects each row of reference cells from the bit line pairs when the pair of redundant rows of memory cells is connected to the bit line pairs.

20. The integrated circuit of claim 19, wherein:
the redundant row decode circuitry generates a disable signal that is an input to the row decode circuitry and selectively disables each row of reference cells when the pair of redundant rows of memory cells is connected to the bit line pairs.

21. The integrated circuit of claim 14, wherein:
the redundant row of memory cells are located in the memory cell array independently of the location of the twists in the bit line pairs.

22. The integrated circuit of claim 14, wherein:
the redundant row of memory cells are located in the memory cell array independently of the number of twists in one or more pairs of bit lines.

23. The integrated circuit of claim 14, wherein:
the memory cell array includes a plurality of pairs of redundant rows of memory cells, each pair of redundant rows of memory cells being configurable for replacing any one row or memory cells having a defect.

24. A method of accessing a dynamic random access memory (DRAM) device having a memory array organized in a plurality of rows and columns of memory cells, a plurality of bit lines grouped into pairs, one or more rows of reference cells, and at least one pair of redundant rows of memory cells, comprising the steps of:

receiving an address value corresponding to a row of memory cells having a defect;

disconnecting each row of reference cells from the bit lines;

connecting a pair of redundant rows of memory cells to the bit lines;

sensing a charge differential appearing on the bit lines of the pairs of bit lines;

driving the bit lines of each pair of bit lines towards high and low supply voltage levels based upon the polarity of the charge differential appearing on the pair of bit lines; and     disconnecting the pair of redundant rows of memory cells from the bit lines.

* * * * *